United States Patent
Min et al.

(10) Patent No.: US 7,017,428 B2
(45) Date of Patent: Mar. 28, 2006

(54) TEST KIT FOR SEMICONDUCTOR PACKAGE AND METHOD FOR TESTING SEMICONDUCTOR PACKAGE USING THE SAME

(75) Inventors: Byoung-jun Min, Chungcheongnam (KR); Jeong-ho Bang, Kyungki-do (KR); Hyun-seop Shim, Chungcheongnam (KR); Hyo-geun Chae, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 136 days.

(21) Appl. No.: 10/728,544

(22) Filed: Dec. 4, 2003

(65) Prior Publication Data
US 2004/0112142 A1    Jun. 17, 2004

(30) Foreign Application Priority Data
Dec. 5, 2002    (KR)  ...................... 10-2002-0077084

(51) Int. Cl.
*G01M 19/00*  (2006.01)
(52) U.S. Cl. ...................................... 73/865.3
(58) Field of Classification Search ................ 73/763, 73/768, 772, 776, 781, 788, 865.3
See application file for complete search history.

(56) References Cited

U.S. PATENT DOCUMENTS 5,920,192 A * 7/1999 Kiyokawa ................ 324/158.1
6,341,963 B1 * 1/2002 Hussain ........................ 439/71
6,462,534 B1 * 10/2002 Kang et al. ............... 324/158.1
2001/0000646 A1 * 5/2001 Akram et al. ................ 324/758
2001/0026152 A1 * 10/2001 Kang et al. ............... 324/158.1

FOREIGN PATENT DOCUMENTS

| JP | 13-083207 | 3/2001 |
| KR | 10-0273981 | 9/2000 |
| KR | 10-0351052 | 8/2002 |

OTHER PUBLICATIONS

English language abstract of Korean Patent Registration No. 10-0273981.
English language abstract of Korean Patent Registration No. 10-0351052.
English language abstract of Japanese Patent Registration No.13-083207.

* cited by examiner

*Primary Examiner*—Max Noori
(74) *Attorney, Agent, or Firm*—Marger Johnson & McCollom, P.C.

(57) ABSTRACT

A test kit for a semiconductor package and a method for testing the semiconductor package using the same are provided. The test kit for a semiconductor package includes a pick-and-place tool for picking up and loading/unloading the semiconductor package, a head assembly having a package guider and a socket guider, and a socket which is positioned under the head assembly. The socket guider performs a pre-alignment function for a correct operation of the package guider, before the package guider starts operating. The package guider aligns the semiconductor package.

25 Claims, 12 Drawing Sheets

TEST KIT FOR SEMICONDUCTOR PACKAGE AND METHOD FOR TESTING SEMICONDUCTOR PACKAGE USING THE SAME

This application claims the priority of Korean Patent Application No. 2002-77084, filed on Dec. 5, 2002, in the Korean Intellectual Property Office, the disclosure of which is incorporated herein in its entirety by reference.

BACKGROUND OF THE INVENTION

1. Field of the Invention

This disclosure relates to a test kit for a semiconductor package, and more particularly, to a head assembly and a socket used in testing a semiconductor package.

2. Description of the Related Art

In order to decrease the thickness and the size of semiconductor packages, semiconductor packages using solder balls instead of leads as an external connection terminal, for example, a micro ball grid array (micro BGA) package and a chip scale package (CSP) have been developed.

Generally, the characteristics of semiconductor devices are tested several times during manufacturing using a PC tester including several instruments. Examples of an electrical test of the semiconductor devices using such a tester include an electrical die sorting (EDS) conducted at wafer level, a final test conducted after the assembly of the semiconductor packages has been completed, and reliability tests of semiconductor chips at wafer level and semiconductor packages conducted after the assembly of the semiconductor packages has been completed.

Further, examples of the final test include a room temperature electrical final test, a cold temperature electrical final test conducted at a temperature lower than the room temperature, and a hot temperature electrical final test conducted at a temperature higher than the room temperature. Also, a burn-in test is an inspection for judging whether the semiconductor devices are usable after a high temperature and a high voltage are applied thereto in order to detect possible defective semiconductor devices. That is, the semiconductor devices presenting a highly defective possibility are preliminarily eliminated before shipped to a customer.

The EDS test of the semiconductor devices using the tester is classified into a serial test and a parallel test. In the serial test, one semiconductor package is tested at a time, while in the parallel test, a large number of semiconductor chips or a large number of semiconductor packages are tested simultaneously and bulk-tested.

Since 32-256 sockets are mounted in one interface board used in the burn-in test and in the parallel test, a large number of the semiconductor chips or a large number of the semiconductor packages can be tested simultaneously and bulk-tested through the -in test and the parallel test.

FIG. 1 is a plan view illustration of a socket contact board 20 of a socket in which an adapter is mounted in a test kit for a semiconductor package according to a prior art, and FIG. 2 is a cross-sectional view illustration for explaining the loading of the semiconductor package using the socket contact board 20 of FIG. 1.

Specifically, FIGS. 1 and 2 show the socket contact board 20 included in a socket of an interface board used in a micro BGA package or a CSP using solder balls as an external connection terminal. In the socket contact board 20, a number of socket pins 34, which are in one-to-one correspondence with external connection terminals 32 of a semiconductor package 30, are arranged in an array pattern. An adapter 41 matching the size of a body of the semiconductor package 30 is installed on the socket contact board 20 through fixators 42.

Since the adapter 41 has an inclined surface 40 formed inside thereof, the package body sliding along the inclined surface 40 is positioned in the adapters 41 and is correctly loaded on the socket contact board 20. Thus, the external connection terminals 32 are correctly connected to the socket pins 34 of the socket contact board 20.

In order to mount as many as possible semiconductor chips in one wafer, research on reducing the size of the semiconductor chips has been continuously carried out. A reduction in the size of the semiconductor chips implies a reduction in the size of the semiconductor packages. For example, in a case where the size of the package body is reduced as indicated by a dotted line 50 in FIG. 1, it is difficult to use the conventional adapter 41 due to a difference in size between the adapter 41 and the reduced package body. That is, the external connection terminals 32 and the socket pins 34 are not correctly connected when the small-sized semiconductor package 30 is loaded on the socket contact board 20. Thus, if the size of the semiconductor package 30 changes, a new adapter is indispensably needed.

FIG. 3 is a plan view illustration of the socket contact board 20 for explaining the use of a newer adapter 41A to accommodate a change in the size of the semiconductor package.

As shown in FIG. 3, in a case where the size of the package body and an array pattern of solder balls used as an external connection terminal changes greatly, the adapter 41A whose shape is modified to be suitable for the modification of the semiconductor package is attached to the package body using fixators 42, and then an electrical test is conducted on the semiconductor package. That is, in this case, the new adapter 41A is indispensably needed in the electrical test.

Also, in a case where a parallel test or a -in test is conducted on the semiconductor package, a large number of the interface boards are required to be newly manufactured or exchanged, even if the shape of the semiconductor package slightly changes. As a result, the cost needed for testing the semiconductor package increases.

Further, if the size of the package body changes, a new adapter die must be manufactured and the existing adapters must be removed from a large number of the sockets mounted in one interface board and exchanged with new adapters. Further, since separate interfaces boards are needed with respect to each of the semiconductor packages, efficiency in a process for testing the semiconductor package is reduced.

Embodiments of the invention address these and other limitations in the prior art.

SUMMARY OF THE INVENTION

Embodiments of the invention provide a test kit for a semiconductor package in which a head assembly used in loading a semiconductor package performs a function of an adapter which is installed on a socket contact board, and a socket is made in a universal type which can be used irrespective of the size of a package body and an array pattern of an external connection terminal.

Other embodiments of the invention provide a method for testing a semiconductor package using the test kit.

BRIEF DESCRIPTION OF THE DRAWINGS

The above and other aspects and advantages of the present invention will become more apparent by describing in detail preferred embodiments thereof with reference to the attached drawings in which.

DETAILED DESCRIPTION OF THE INVENTION

Embodiments of the present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete and will fully convey the concept of the invention to those of ordinary skill in the art. A free-sized adapter referred in embodiments of the present invention should not be construed as being limited to the embodiments set forth herein.

Various changes in the present invention may be made therein without departing from the spirit and scope of the present invention as defined by the appended claims. It will be understood by those of ordinary skill in the art that, for example, a structure of a socket, a shape of a socket pin, a socket guider of a head assembly, etc. may be slightly modified.

Figure 1:
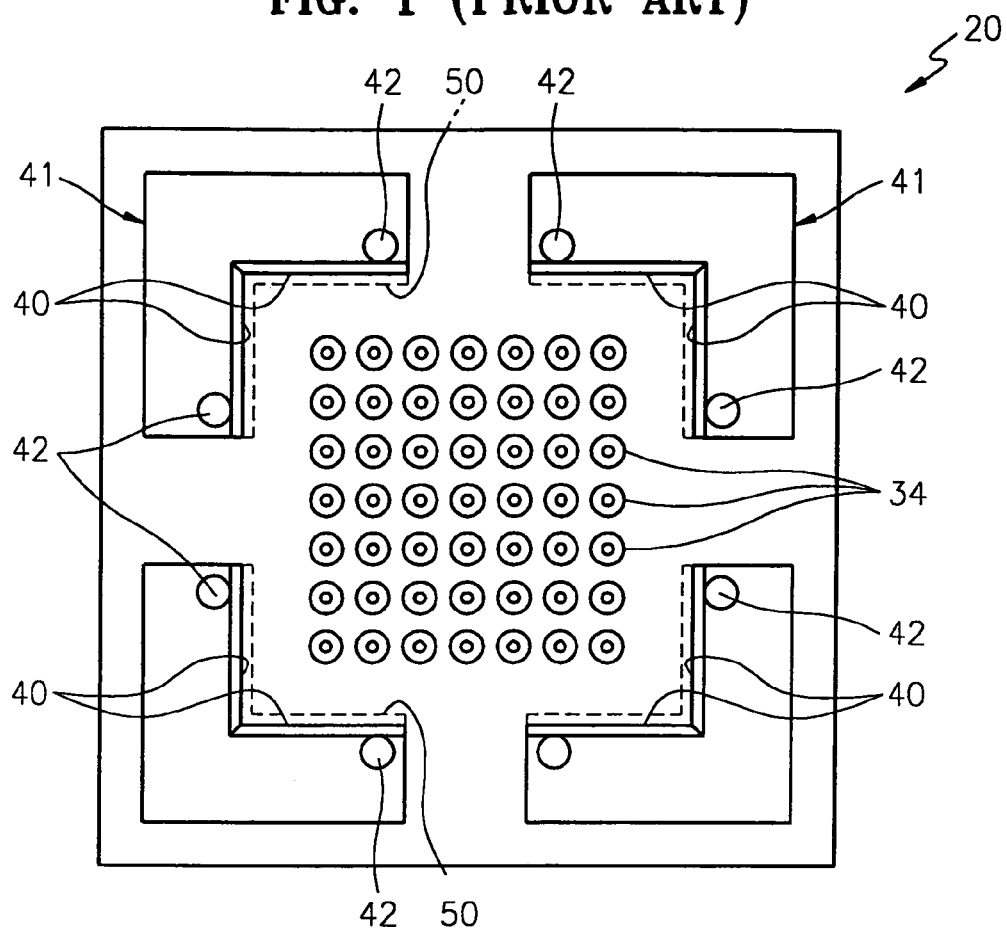
FIG. 1. is a top view illustration of a socket contact board of a socket on which an adapter is mounted in a test kit for a semiconductor package according to a prior art.
Figure 2:
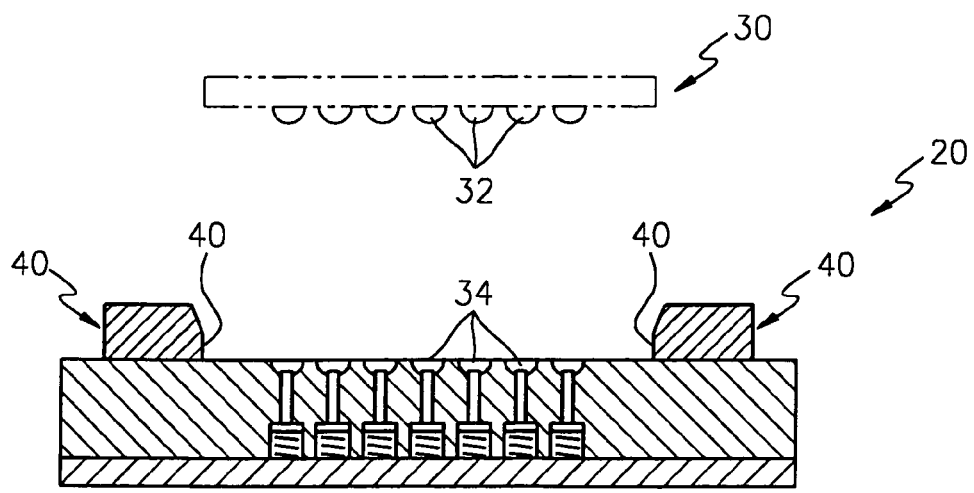
FIG. 2 is a cross-sectional view illustration for explaining the loading of the semiconductor package using the socket contact board of FIG. 1.
Figure 3:
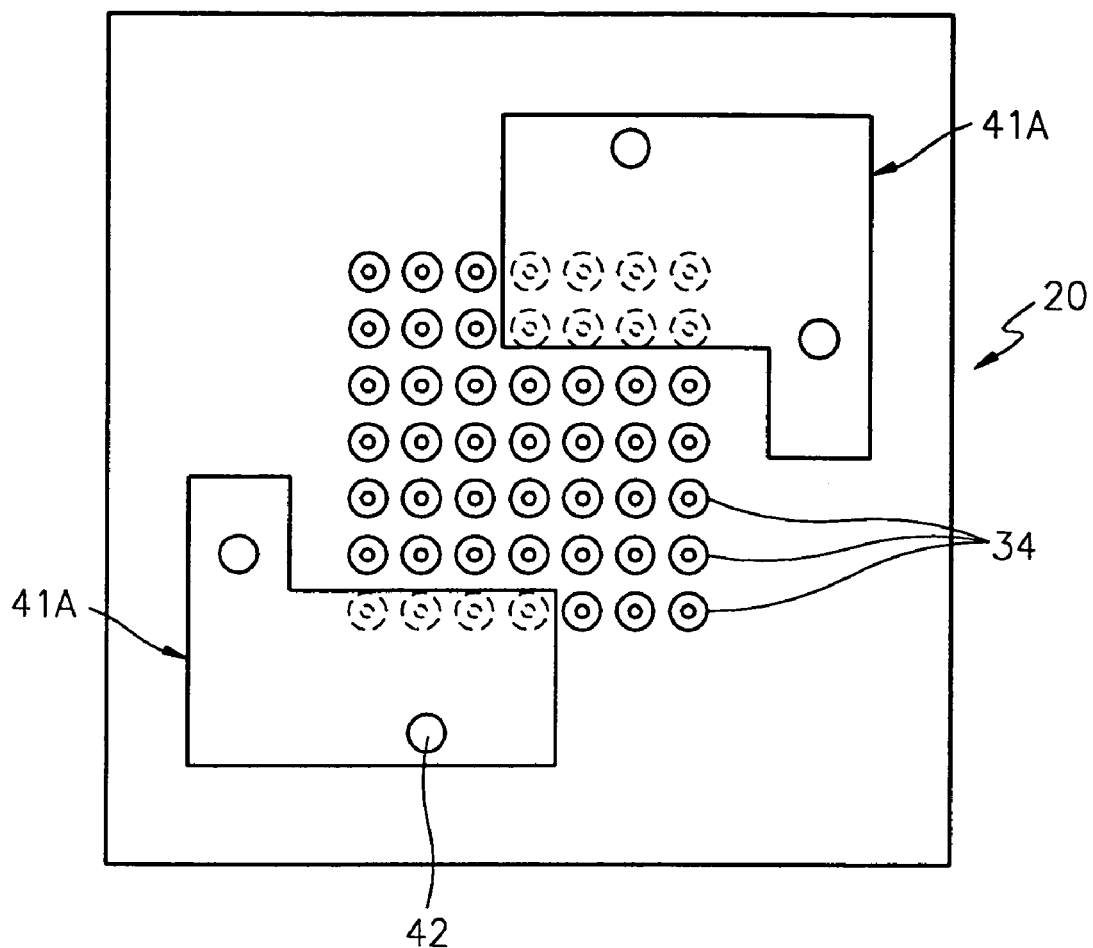
FIG. 3 is a top view illustration of the socket contact board of FIG. 1 for explaining the use of an adapter due to changes in size of the semiconductor package.
Figure 4:
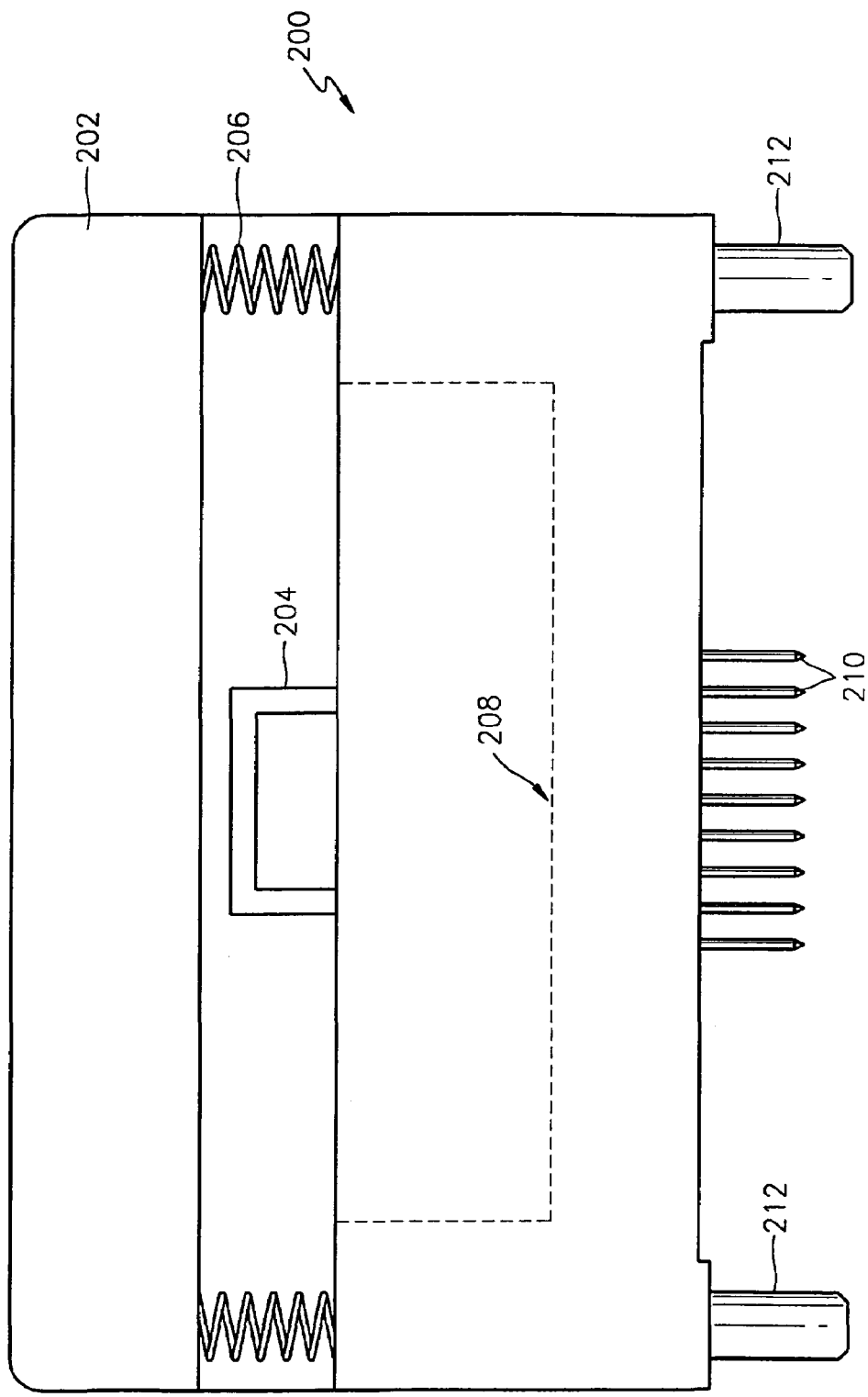
FIG. 4 is a side view illustration of a socket according to an embodiment of the present invention.
Figure 5:
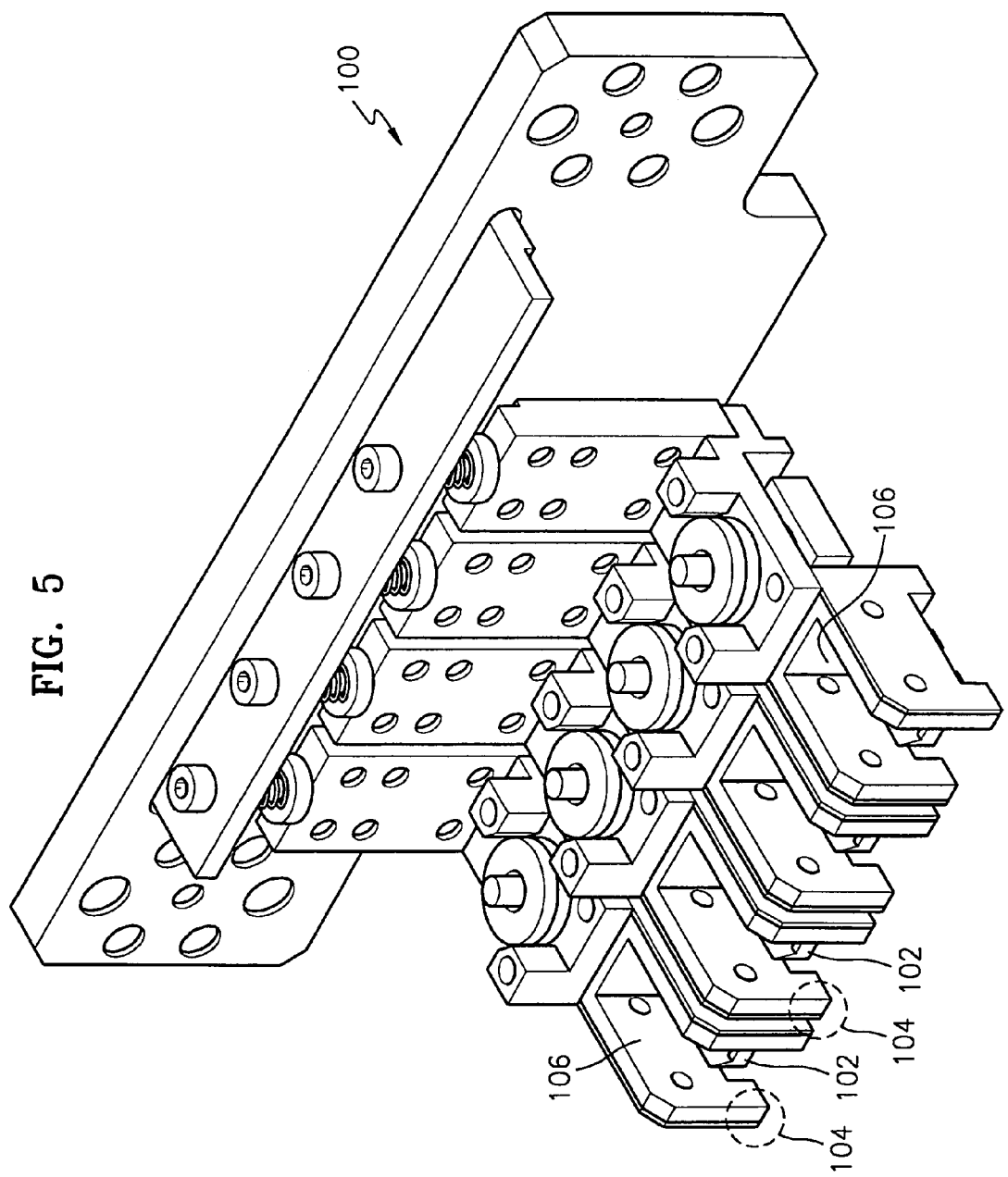
FIG. 5 is a perspective view illustration of a head assembly of a test kit for a semiconductor package according to an embodiment of the present invention.
Figure 6:
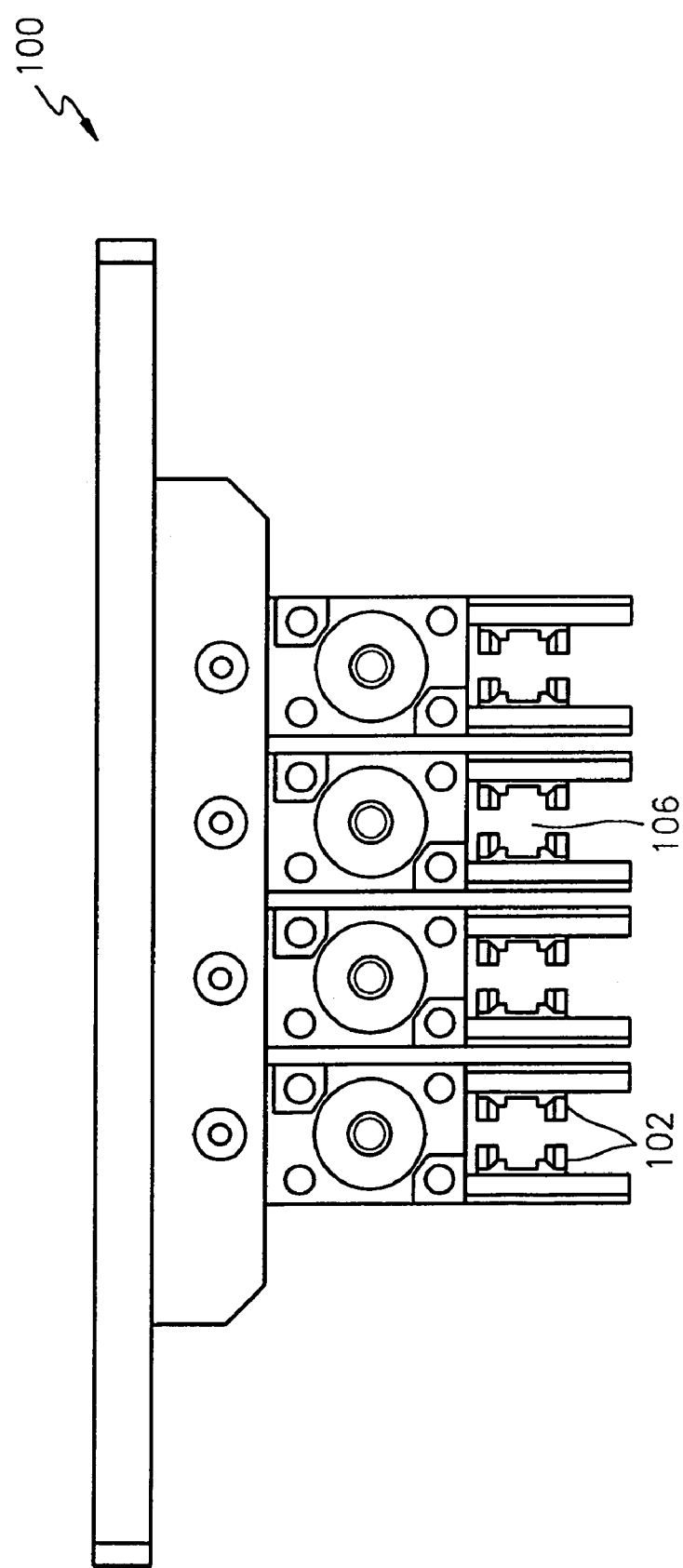
FIG. 6 is a top view illustration of the head assembly shown in FIG. 5.
Figure 7:
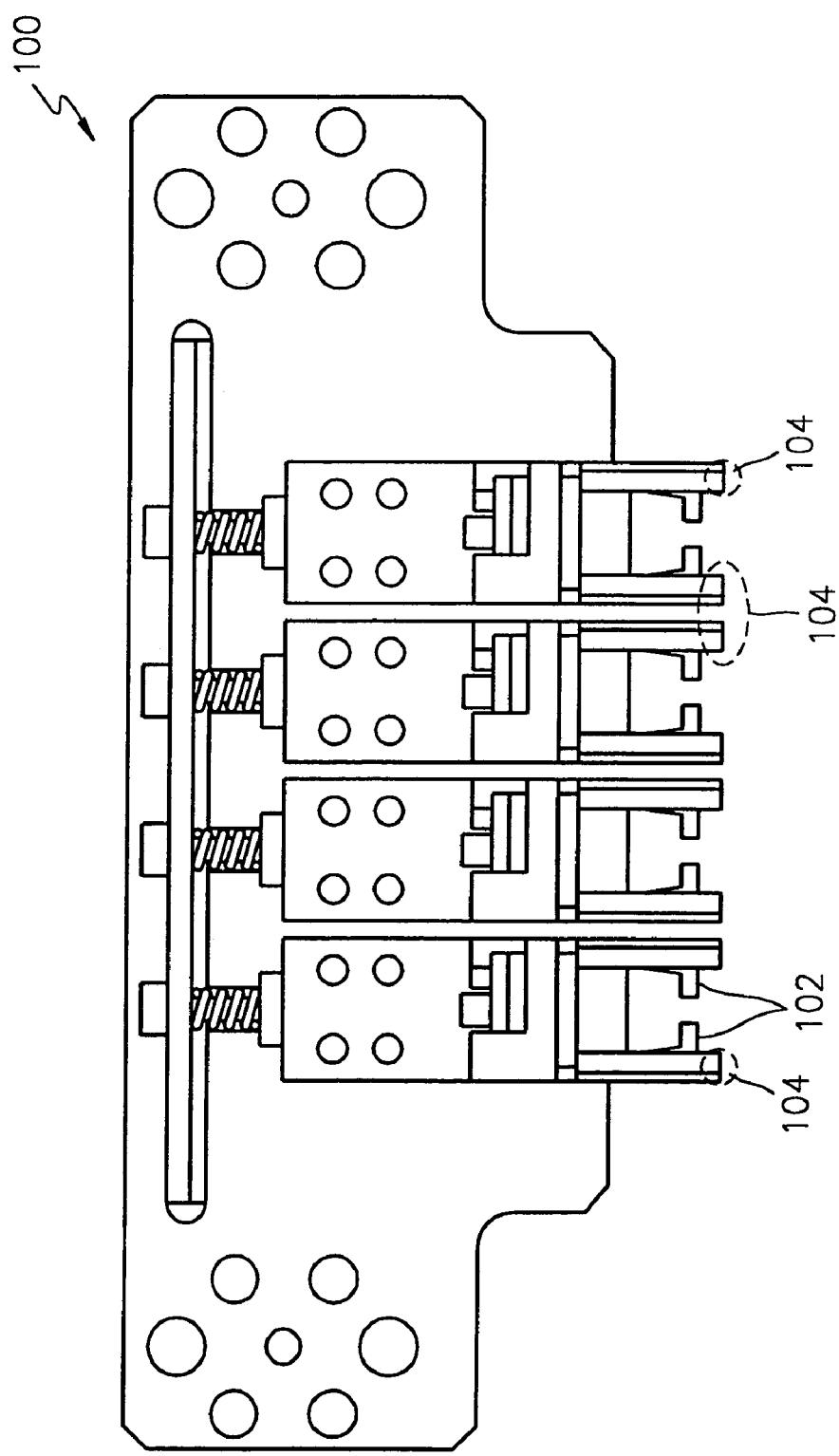
FIG. 7 is a front view illustration of the head assembly shown in FIG. 5.

FIG. 4 is a side view illustration of a socket 200 according to an embodiment of the present invention. FIG. 5 is an isometric view illustration of the head assembly 100 of a test kit for the semiconductor package according to embodiments of the present invention, FIG. 6 is a top view illustration of the head assembly 100, and FIG. 7 is a front view illustration of the head assembly 100.

As shown in FIG. 4, the socket 200 includes a socket cover 202, a socket contact board 208, and a latch 204. The socket cover 202 is positioned on an uppermost portion of the socket 200 and is used for performing a pre-alignment of a head assembly 100 (FIG. 5) and the socket 200 when the socket cover 202 contacts a socket guider 104 of the head assembly 100. Further, when an upper portion of the socket cover 202 is pressed, the socket cover 202 together with a spring 206 operate to open or close socket pins 210 of the socket contact board 208 so that a semiconductor package is connected to a tester (not shown).

The socket contact board 208 is a printed circuit board (PCB) having the socket pins 210 to which external connection terminals of the semiconductor package are electrically connected and which are arranged in an array pattern. The socket contact board 208 is a universal socket contact board capable of being applied to all general semiconductor packages as well as a specific semiconductor package. The socket contact board 208 will be described in detail with reference to FIG. 11.

The latch 204 is positioned on the socket contact board 208 and is opened by a pressing force of a package guider 102 (FIG. 5) of the head assembly 100, thereby allowing the semiconductor package to be loaded/unloaded. If the pressing force of the package guider 102 is no longer applied, the latch 204 fixes the semiconductor package on the socket contact board 208.

Referring to FIGS. 5 through 7, the head assembly 100 according to an embodiment of the present invention performs an alignment function of a conventional adapter. Since embodiments describe a burn-in test and a parallel test for testing a plurality of semiconductor packages simultaneously, the head assembly 100 can simultaneously load or unload a number of semiconductor packages. The head assembly 100 has a pick-and-place tool operating space 106 where a pick-and-place tool 300 (FIG. 10), which is used in loading or unloading a number of semiconductor packages, operates. Here, the head assembly 100 includes four unit head assemblies 101, and the unit head assemblies 101 each have a package guider 102 and a socket guider 104. The package guider 102 and the socket guider 104 perform a function of the conventional adapter.

Figure 8:
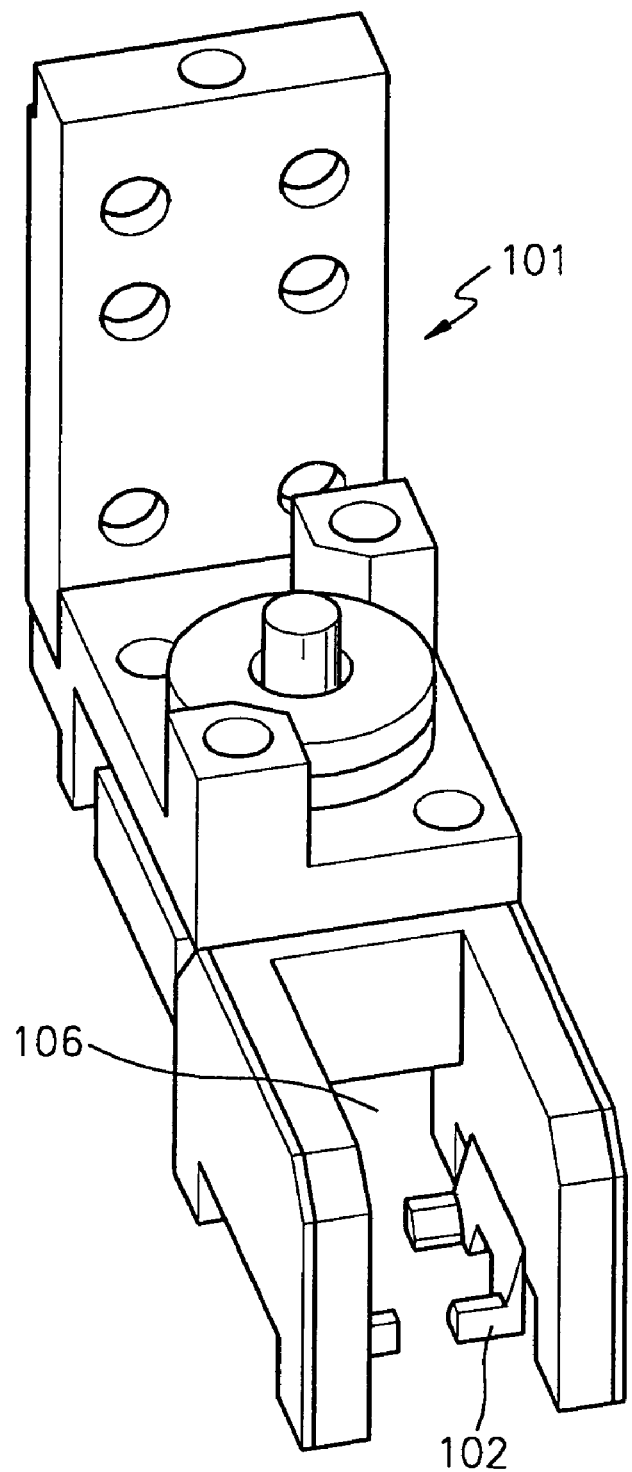
FIG. 8 is an isometric view illustration of a unit head assembly according to another embodiment of the present invention.

FIG. 8 is an isometric view of the unit head assembly 101. As shown in FIG. 8, the package guider 102 positioned under the pick-and-place tool operating space 106 of the unit head assembly 101 has a similar structure to that of the conventional adapter formed inside the socket. Thus, the package guider 102 performs a function of aligning the semiconductor package when the semiconductor package is loaded on the socket contact board 208. Further, the package guider 102 presses the latch 204 (FIG. 4) on the socket contact board 208 so that the latch 204 is opened, thereby correctly connecting the external connection terminals of the semiconductor package to the socket pins 210 of the socket contact board 208.

The number of the sockets that are mounted in a general interface board may range from at least 32 to 256, and the number of the interface boards used in a general semiconductor package is also large. Thus, a lot of effort and time are required for the exchange job of changing the adapters of the prior art due to the changes in size of the semiconductor packages.

That is, where the size of the semiconductor package changes, while all of the conventional adapters formed inside the socket would need to be changed, only the package guider 102 of the unit head assembly 101 is changed in this embodiment of the present invention. Thus, since the change of the adapters caused by changes in size of the semiconductor packages is not needed, effort and time required due to changing the adapters are saved.

Figure 9:
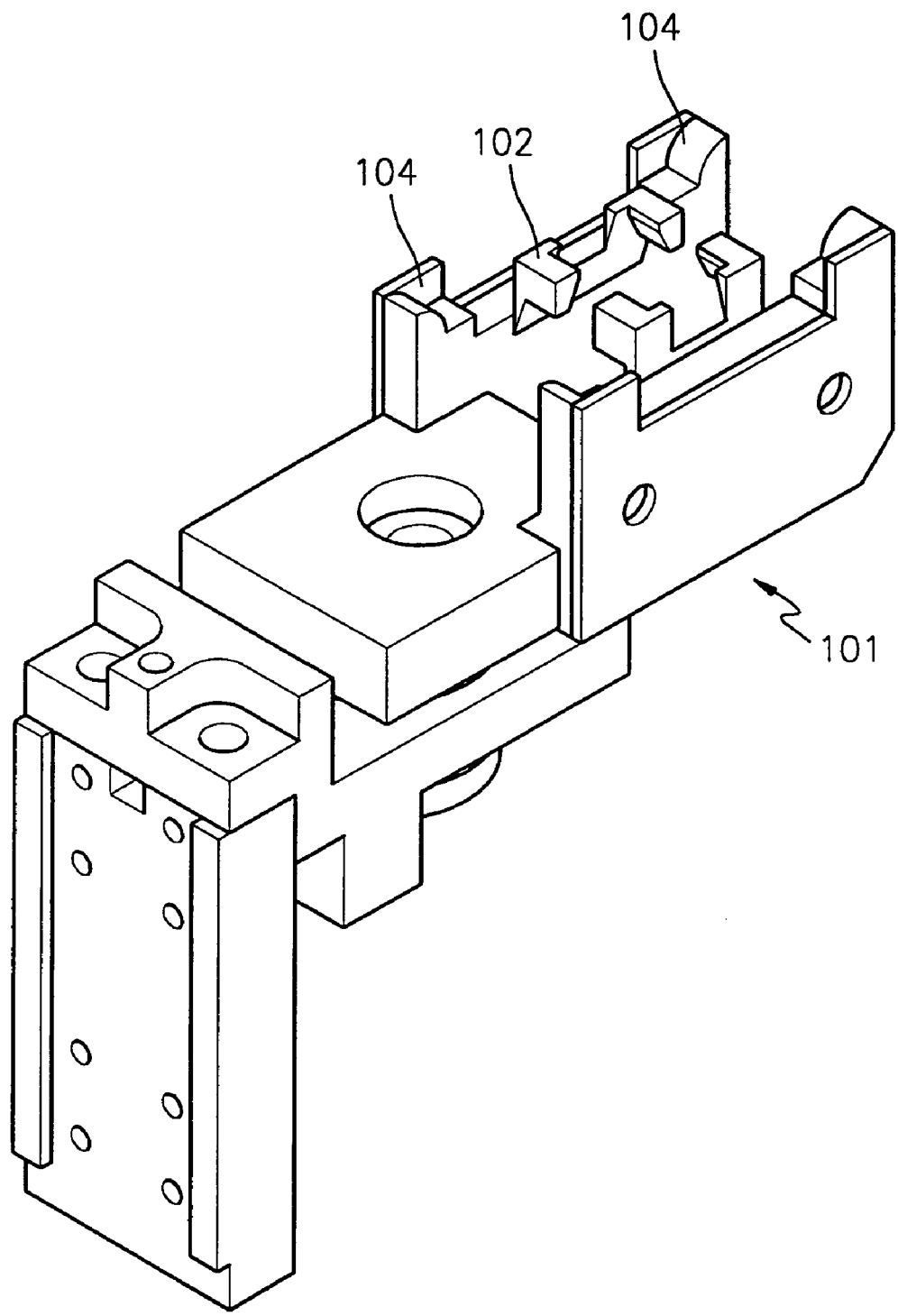
FIG. 9 is an isometric view illustration of a lower portion of the unit head assembly shown in FIG. 8.

FIG. 9 is an isometric view of a lower portion of the unit head assembly 101 shown in FIG. 8.

As shown in FIG. 9, if the alignment of the unit head assembly 101 and the socket cover 202 (FIG. 11) deviates when they contact each other, it is difficult to correctly connect the socket pins 210 of the socket contact board 208 (FIG. 11) with the external connection terminals 402 (FIG. 10) of the semiconductor package even if the package guider 102 operates normally. In order to solve the above problem, four corners of the socket cover 202 (FIG. 11) slide along inclined surfaces formed at ends of the socket guider 104 and are correctly inserted into the socket guider 104. Thus, the socket guider 104 performs the pre-alignment function for correctly matching a position of the unit head assembly 101 to a position of the socket 200 before the package guider 102 operates.

Figure 10:
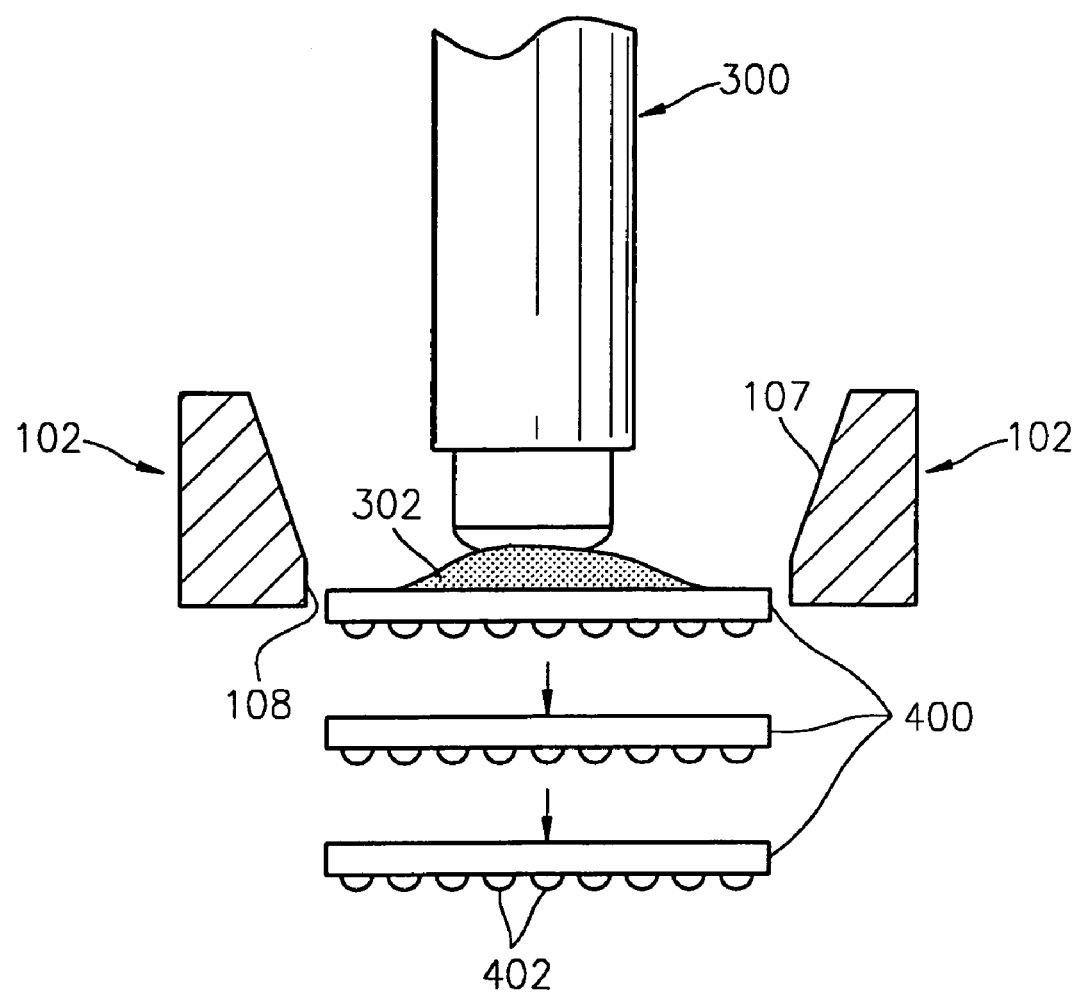
FIG. 10 is a cross-sectional illustration for explaining a process of loading the semiconductor package through a package guide of a head assembly according to yet another embodiment of the present invention.

FIG. 10 is a side view diagram for explaining a process for loading the semiconductor package through the package guider 102 of the unit head assembly 101 according embodiments of the present invention.

As shown in FIG. 10, the pick-and-place tool 300 has a vacuum suction unit 302 which sucks and moves a body of a semiconductor package 400 by a vacuum force. If the vacuum force of the vacuum suction unit 302 is removed, the semiconductor package 400 separates from the vacuum suction unit 302 and is loaded on the socket contact board 208. Here, since the package guider 102 has an inclined portion 107, even if an error occurs in the loading position of the semiconductor package 400 using the pick-and-place tool 300, the semiconductor package 400 sliding along the inclined portion 107 is correctly aligned in an alignment portion 108, falls toward the socket contact board 208, and is correctly loaded on the socket contact board 208.

Figure 11:
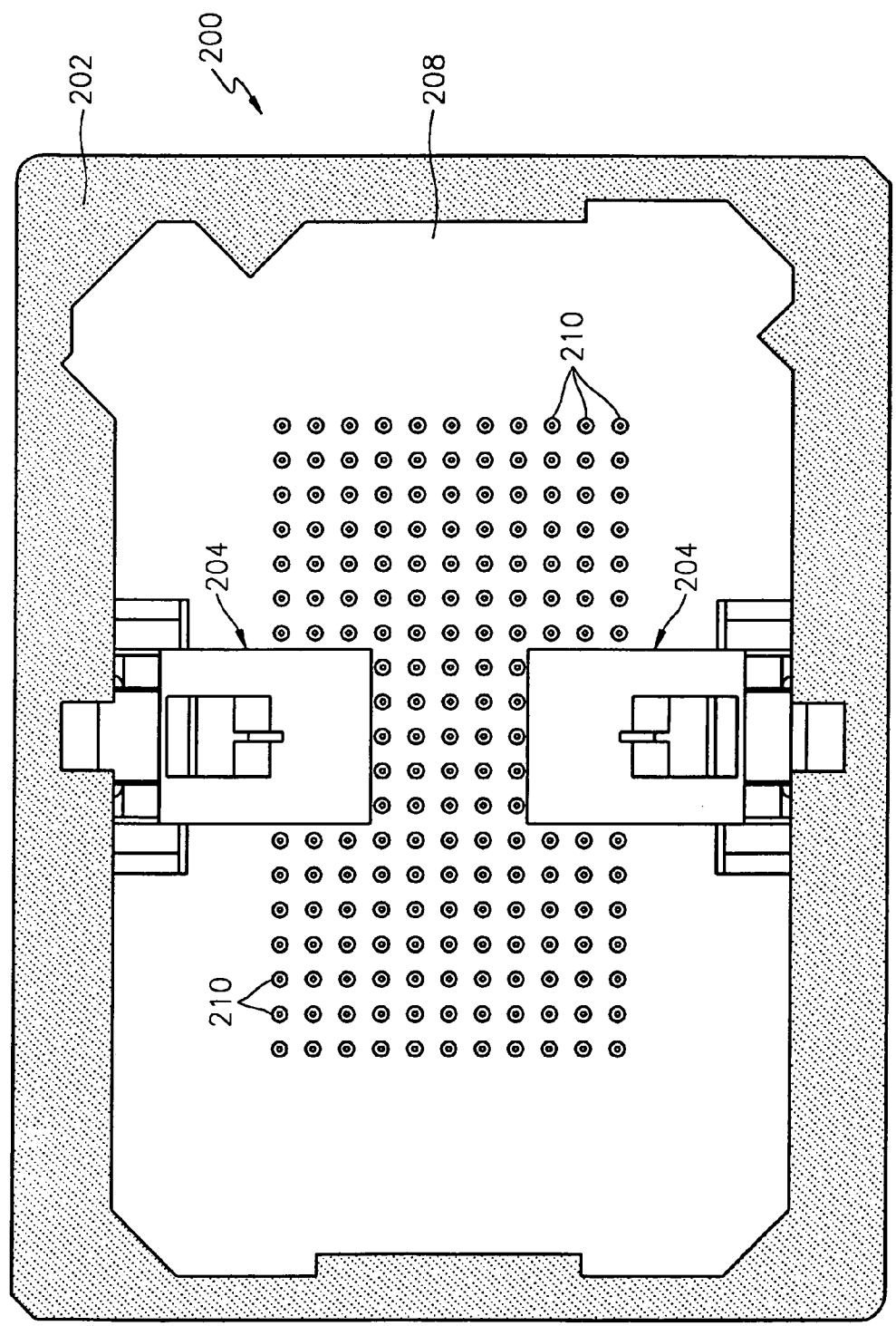
FIG. 11 is a top view illustration of a socket according to an embodiment of the present invention.

FIG. 11 is a top view of a socket 200 according to an embodiment of the present invention. As shown in FIG. 11, an adapter is not separately installed on the socket contact board 208 of the socket 200, because the package guider 102 and the socket guider 104 of the head assembly 100 perform the function of the conventional adapter in the process for loading the semiconductor package. Thus, where the size of the semiconductor package changes, the job of changing the conventional adapter, which requires much effort and time, does not need to be performed. However, a free-sized adapter 220 (FIG. 12) may be installed on the socket contact board 208. The free-sized adapter 220 is not installed for the purpose of the alignment of the semiconductor package as in the conventional adapter. The free-sized adapter 220 is instead installed to ensure a space for positioning the package guider 102 when the external connection terminals are connected to the socket pins 210 on the socket contact board 208 during the loading of the semiconductor package. The free-sized adapter 220 will be described in detail with reference to FIG. 12.

Figure 12:
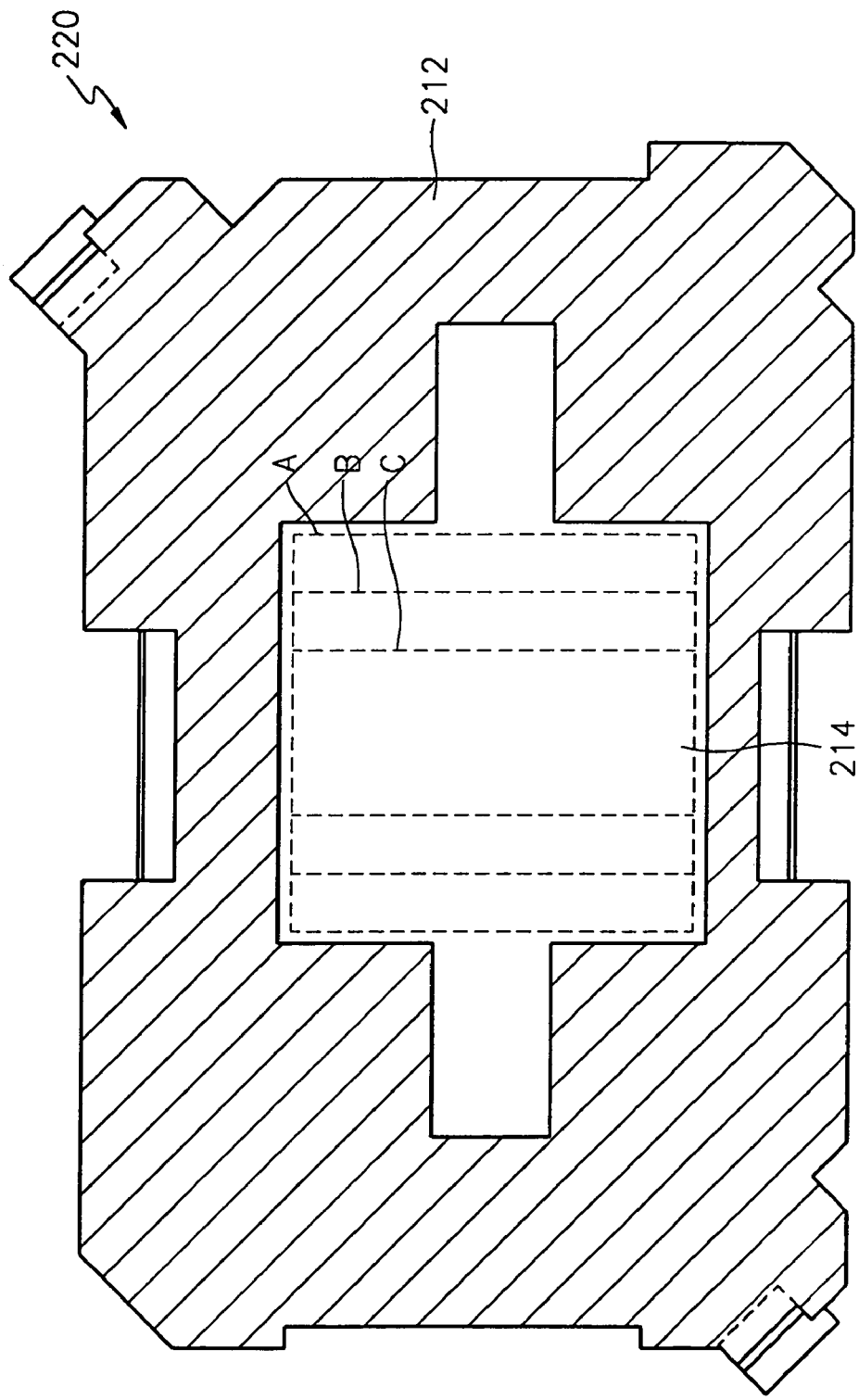
FIG. 12 is a top view illustration of a free-sized adapter according to yet another embodiment of the present invention.

FIG. 12 is a top view illustration of the free-sized adapter 220 according to embodiments of the present invention. As shown in FIG. 12, the free-sized adapter 220 includes a support portion 212 and an opening 214. The support portion 212 prevents damage to a surface of the socket contact board capable of being generated when the package guider 102 (FIG. 8) moves down, and ensures a space for positioning the package guider 102. Here, the size of the semiconductor package loaded through the package guider 102 may not be equal to that of the opening 214 of the free-sized adapter 220.

The free-sized adapter 220 can be commonly used in all semiconductor packages having the size indicated by broken lines A, B, and C of FIG. 12. For example, BGA packages having 54 external connection terminals may be classified into four types of BGA packages having different sizes. In this case, only one free-sized adapter 220 is needed for use with the four types of BGA packages. Since the free-sized adapter 220 may be made of a plastic material, the free-sized adapter 220 can bend relatively easily. Further, since the free-sized adapter 220 does not perform the alignment function, and this free-sized adapter 220 is not restricted to one position, it is relatively easy to install the free-sized adapter 220 on a socket contact board.

For example, if adapters must be exchanged due to the changes in size of the semiconductor package as in the prior art, it takes 12 hours to install adapters in 12 sheets of interface board for the burm-in test which each has 240 sockets. However, if the head assembly having a package guider and a socket guider is used and the existing adapter is changed with the free-sized adapter 220 as in embodiments of the present invention, it takes about 30 minutes to install the free-sized adapter in 12 sheets of interface board each having 240 sockets. Thus, the changing time of the adapters is reduced greatly.

Figure 13:
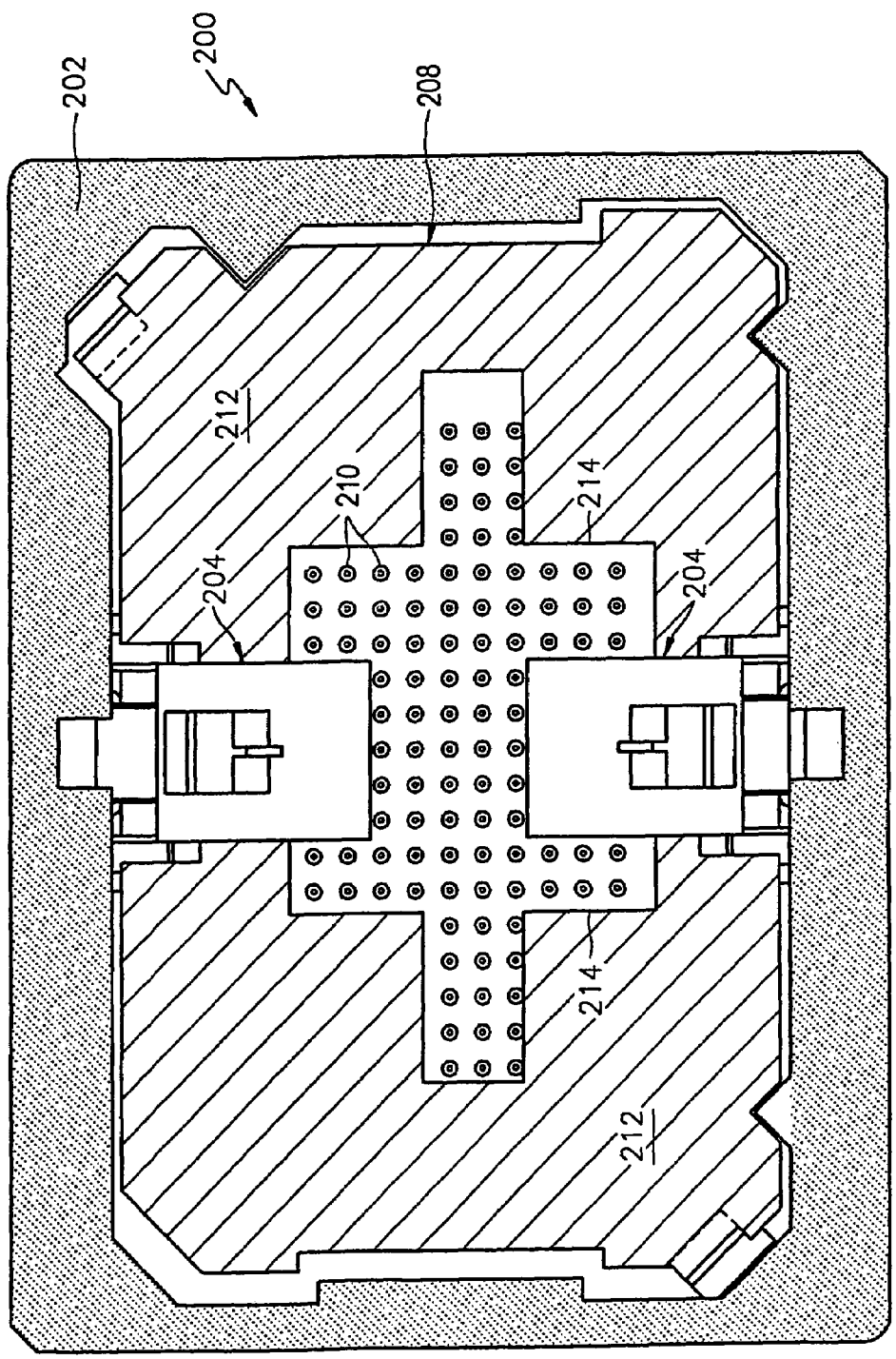
FIG. 13 is a top view illustration of a socket in which a free-sized adapter is mounted according to yet another embodiment of the present invention.

FIG. 13 is a top view illustration of a socket 200 in which the free-sized adapter 220 is mounted according to an embodiment of the present invention. As shown in FIG. 13, since the support portion 212 of the free-sized adapter covers most of area of the socket contact board of the socket 200, the support portion 212 prevents the damage to the surface of the socket contact board that could otherwise occur when the package guider moves down. Further, the socket pins 210 are arranged inside the opening 214 of the free-sized adapter in the array pattern. Since the latch 204 fixes the semiconductor package aligned inside the opening 214, the socket pins 210 can be connected to the external connection terminals irrespective of the size of the semiconductor package.

Hereinafter, a testing method using a test kit for the semiconductor package will be described according to another embodiment of the present invention.

An interface board which has 32-256 sockets and simultaneously performs an electrical test for a plurality of semiconductor packages is prepared. Here, an adapter is not yet installed in each of the sockets of the interface board (FIGS. 11 and 13). A first alignment is performed by respectively docking socket guiders of head assemblies on socket covers of the sockets of the interface board. Thus, the head assemblies and the sockets are aligned correctly.

Next, package guiders of the head assemblies are inserted into the sockets so that latches on socket contact boards are opened. The semiconductor packages are mounted on the socket contact boards by performing a second alignment of the semiconductor packages using package guiders in pick-and-place tool operating spaces (FIG. 8) of the head assemblies. Thereafter, the latches press and fix the semiconductor packages so that the semiconductor packages are separated from a vacuum suction unit of a pick-and-place tool. Finally, the head assemblies are separated from the sockets. The test method can be used in a parallel test and a -in-test.

As described above, embodiments of the present invention have advantages over conventional adaptors since a head assembly performs functions of a conventional adapter formed on a socket contact board so that the adapter is no longer necessary.

Therefore, one interface board can be commonly used for several kinds of semiconductor packages. Thus, the test cost needed for an electrical test of the semiconductor packages is reduced, and the efficiency of the electrical test increases.

Also, when a free-sized adapter is used as needed, the test cost needed for the development and the die design of the adapter is reduced and the cost and the time for the changing of the adapter are reduced.

Particular embodiments of the invention will now be discussed.

According to an aspect of an embodiment of the present invention, there is provided a test kit for a semiconductor package including a pick-and-place tool for picking up and loading/unloading the semiconductor packages; a head assembly which includes a package guider for aligning the semiconductor package falling from the pick-and-place tool, and a socket guider for pressing a socket cover at an edge of the package guider before the package guider operates and performing a pre-alignment function for the correct operation of the package guider when the socket guider contacts the socket cover; and a socket which is positioned under the head assembly and connects the semiconductor package loaded by the pick-and-place tool and the head assembly to a tester.

In another aspect of an embodiment of the present invention, the socket includes the socket cover which is located on an uppermost portion of the socket and is used in the pre-alignment performed by the socket guider of the head assembly; a socket contact board which is positioned under the socket cover and has a plurality of socket pins which are electrically connected with external connection terminals of the semiconductor package and are arranged in an array pattern; and a latch which is positioned on the socket contact board and is opened by a pressing force of the package guider, the latch allowing the semiconductor package to be loaded/unloaded and fixing the semiconductor package if the pressing force of the package guider disappears.

The socket contact board may be a universal socket contact board capable of being applied to all of general semiconductor packages as well as a specific semiconductor package. Further, the socket may further include a free-sized adapter formed on the socket contact board.

The free-sized adapter ensures a space for positioning the package guider when the external connection terminals of the semiconductor package are connected to the socket pins of the socket contact board and protects surfaces of the socket contact board. Further, the free-sized adapter may include a support portion and an opening and is made of a flexible plastic material.

The pick-and-place tool sucks a body of the semiconductor package by a vacuum force and loads/unloads the semiconductor package.

The head assembly may load/unload a plurality of semiconductor packages simultaneously and includes the package guider. Further, the package guider includes inclined portions which are formed at four corners of the package guider and an alignment portion in which the semiconductor package sliding along the inclined portion falls in an alignment state, the package body sliding while contacting the inclined portions and being aligned.

Four corners of the socket cover slide along inclined surfaces formed at ends of the socket guider when the socket cover is pressed and are correctly inserted into the socket guider so that the socket guider performs an alignment function of correctly matching a position of the head assembly with a position of the socket.

The socket can be used in an interface board for a parallel test or a burn-in test of the semiconductor package.

According to another embodiment of the present invention, there is provided a method for testing a semiconductor package. The method includes preparing an interface board which has a plurality of sockets and is used in performing an electrical test of the semiconductor package; performing a first alignment by docking a socket guider of a head assembly on a socket cover of the socket; opening a latch of the socket by pressing the socket cover using a package guider of the head assembly; performing a second alignment for the semiconductor package loaded to a pick-and-place tool by the package guider to mount on a socket contact board formed inside the socket; fixing the semiconductor package using the latch if the pressing force of the package guider disappears; separating the semiconductor package from the pick-and-place tool; and performing an electrical test for the semiconductor package mounted on a socket contact board.

The interface board may be used for a final test of the semiconductor package. The final test is any one of high temperature, room temperature, and low temperature tests.

The interface board is used for a burn-in test of the semiconductor package.

The first alignment is performed in a state where four corners of the socket guider correctly contact four corners of the socket cover. The second alignment includes positioning the semiconductor package sliding along the inclined portions of the package guider in a correct position, and passing the semiconductor package positioned in the correct position through an alignment portion to fall down at right angles.

The socket contact board further includes a structure which is formed on the socket contact board, ensures a space for positioning the package guider when the semiconductor package is loaded, and protects a surface of the socket contact board. The structure is a free-sized adapter having a general structure that can be applied irrespective of a type of an external connection terminal of the semiconductor package.

The latch fixes the semiconductor package by pressing an upper portion of the semiconductor package. The semiconductor package can use solder balls as the external connection terminals.

According to another embodiment of the present invention, since the head assembly performs a function of a conventional adapter, the conventional adapter is removed and the free-sized adapter is used instead, one interface board can be commonly used in several kinds of semiconductor packages. Thus, the test cost needed for an electrical test of the semiconductor packages is reduced, and the efficiency of the electrical test increases. Further, the test cost needed for the development and the die design of the adapter are reduced and the cost and the time for the exchange of the adapter are reduced.

While the present invention has been particularly shown and described with reference to preferred embodiments thereof, it will be understood by those of ordinary skill in the art that various changes in form and details may be made therein without departing from the spirit and scope of the present invention as defined by the appended claims.

What is claimed is:

1. A test kit for a semiconductor package comprising:
   a pick-and-place tool structured to load/unload the semiconductor package;
   a head assembly coupled with the pick-and-place tool; and a socket underneath the head assembly, the socket being configured to connect the semiconductor package loaded by the pick-and-place tool and the head assembly to a tester, the head assembly including an upwardly disposed package guider configured automatically to align the semiconductor package as the package is released by and falls from the pick-and-place tool, and a downwardly disposed socket guider mounting the upwardly disposed package guider, the socket guider configured automatically to pre-align the head assembly with a position of the socket by downward contact between the socket guider and a socket cover connected with the socket before operation of the package guider, the socket aligned with and positioned under the socket cover.

2. The test kit for the semiconductor package of claim 1, wherein the socket includes:

the socket cover positioned on an uppermost portion of the socket and to be used in the pre-alignment function performed by the socket guider of the head assembly;

a socket contact board positioned under the socket cover and having a plurality of socket pins arranged in an array pattern and for electrically connecting to the external connection terminals of the semiconductor package; and a latch positioned on the socket contact board, the latch structured to be opened by a pressing force of the package guider, the latch allowing the semiconductor package to be loaded/unloaded and fixing the semiconductor package when the pressing force of the package guider is removed.

3. The test kit for the semiconductor package of claim 2, wherein the socket contact board is a universal socket contact board capable of receiving more than one type of semiconductor package.

4. The test kit for the semiconductor package of claim 1, wherein the socket further includes a free-sized adapter formed on the socket contact board.

5. A test kit for a semiconductor package comprising:
a pick-and-place tool structured to load/unload the semiconductor package;
a head assembly including a package guider for aligning the semiconductor package falling from the pick-and-place tool, and a socket guider for pressing a socket cover at an edge of the package guider before the package guider operates and for performing a pre-alignment function for an operation of the package guider when the socket guider contacts the socket cover; and
a socket which is positioned under the head assembly and connects the semiconductor package loaded by the pick-and-place tool and the head assembly to a tester, wherein the socket includes a free-sized adapter formed on the socket contact board,
wherein the free-sized adapter is structured to ensure a space for positioning the package guider when the external connection terminals of the semiconductor package are connected to the socket pins of the socket contact board and to protect surfaces of the socket contact board.

6. The test kit for the semiconductor package of claim 5, wherein the free-sized adapter includes a support portion and an opening.

7. The test kit for the semiconductor package of claim 5, wherein the free-sized adapter is made of a flexible plastic material.

8. The test kit for the semiconductor package of claim 1, wherein the pick-and-place tool is structured to pick a body of the semiconductor package by a vacuum force and to load/unload the semiconductor package.

9. The test kit for the semiconductor package of claim 1, wherein the head assembly is structured to load/unload a plurality of semiconductor packages simultaneously.

10. A test kit for a semiconductor package comprising:
a pick-and-place tool structured to load/unload the semiconductor package;
a head assembly including a package guider for aligning the semiconductor package falling from the pick-and-place tool, and a socket guider for pressing a socket cover at an edge of the package guider before the package guider operates and for performing a pre-alignment function for an operation of the package guider when the socket guider contacts the socket cover; and
a socket which is positioned under the head assembly and connects the semiconductor package loaded by the pick-and-place tool and the head assembly to a tester,
wherein the package guider of the head assembly includes:
inclined portions which are formed at four corners of the package guider, the semiconductor package body sliding while contacting one or more of the inclined portions and being aligned; and
an alignment portion in which the semiconductor package sliding along one or more of the inclined portions falls in an aligned state.

11. A test kit for the semiconductor package comprising:
a pick-and-place tool structured to load/unload the semiconductor package;
a head assembly including a package guider for aligning the semiconductor package falling from the pick-and-place tool, and a socket guider for pressing a socket cover at an edge of the package guider before the package guider operates and for performing a pre-alignment function for an operation of the package guider when the socket guider contacts the socket cover; and
a socket which is positioned under the head assembly and connects the semiconductor package loaded by the pick-and-place tool and the head assembly to a tester,
wherein corners of the socket cover slide along one or more of inclined surfaces formed at ends of the socket guider when the socket cover is pressed and are inserted into the socket guider so that the socket guider performs an alignment function of matching a position of the head assembly with a position of the socket.

12. The test kit for the semiconductor package of claim 1, wherein the socket is used in an interface board for a parallel test of semiconductor packages.

13. The test kit for the semiconductor package of claim 1, wherein the socket is used in an interface board for a burn-in test of semiconductor packages.

14. A method for testing a semiconductor package comprising:
performing a first alignment by docking a socket guider of a head assembly on a socket cover of one of a plurality of sockets on an interface board;
opening a latch of the socket by pressing the socket cover using a package guider of the head assembly;
performing a second alignment of the semiconductor package that is loaded in a pick-and-place tool with the package guider;

mounting the semiconductor package on a socket contact board formed inside the socket;

affixing the semiconductor package by the latch by removing pressing force from the package guider;

separating the semiconductor package from the pick-and-place tool; and performing an electrical test for the semiconductor package mounted on the socket contact board.

15. The method of claim 14, wherein the electrical test for the semiconductor package is a parallel test.

16. The method of claim 14, wherein the interface board is used for a final test of the semiconductor package.

17. The method of claim 16, wherein the final test is any one of high temperature, room temperature, and low temperature tests.

18. The method of claim 14, wherein the interface board is used for a burn-in test of the semiconductor package.

19. The method of claim 14, wherein the first alignment includes four corners of the socket guider contacting four corners of the socket cover.

20. The method of claim 14, wherein the pick-and-place tool loads and unloads the semiconductor packages by presence or absence of a vacuum force.

21. The method of claim 14, wherein performing the second alignment comprises:

positioning a semiconductor package that is sliding along inclined portions of the package guider in a correct position; and passing the semiconductor package that is positioned in the correct position through an alignment portion.

22. The method of claim 14, wherein the socket contact board further includes a structure to ensure a space for positioning the package guider when the semiconductor package is loaded, and to protect a surface of the socket contact board.

23. The method of claim 22, wherein the structure is a free-sized adapter having a general structure that can be applied irrespective of a type of an external connection terminal of the semiconductor package.

24. The method of claim 14, wherein the latch fixes the semiconductor package by pressing an upper portion of the semiconductor package.

25. The method of claim 14, wherein the semiconductor package uses solder balls as the external connection terminals.

* * * * *

UNITED STATES PATENT AND TRADEMARK OFFICE
CERTIFICATE OF CORRECTION

PATENT NO. : 7,017,428 B2  Page 1 of 1
APPLICATION NO. : 10/728544
DATED : March 28, 2006
INVENTOR(S) : Min et al.

It is certified that error appears in the above-identified patent and that said Letters Patent is hereby corrected as shown below:

On the Title page, under References Cited item 56, please replace "6,462,534 B1" with --6,462,534 B2--

Column 1, line 54, please replace "the -in" with --the burn-in--

Column 2, line 39, please replace "the -in" with --the burn-in--

Column 6, line 65, please replace "a -in-test" with --a burn-in-test--

Signed and Sealed this

Twentieth Day of February, 2007

JON W. DUDAS
*Director of the United States Patent and Trademark Office*